United States Patent
Mast et al.

(10) Patent No.: US 8,564,492 B2
(45) Date of Patent: Oct. 22, 2013

(54) HORN ANTENNA INCLUDING INTEGRATED ELECTRONICS AND ASSOCIATED METHOD

(75) Inventors: Alan William Mast, Melbourne Beach, FL (US); Gregory M. Jandzio, Melbourne Village, FL (US)

(73) Assignee: Harris Corporation, Melbourne, FL (US)

( * ) Notice: Subject to any disclaimer, the term of this patent is extended or adjusted under 35 U.S.C. 154(b) by 200 days.

(21) Appl. No.: 13/310,094

(22) Filed: Dec. 2, 2011

(65) Prior Publication Data

US 2013/0141299 A1    Jun. 6, 2013

(51) Int. Cl.
*H01Q 13/00*    (2006.01)

(52) U.S. Cl.
USPC .............................. 343/786; 343/772; 343/776

(58) Field of Classification Search
USPC .......................................... 343/786, 772, 776
See application file for complete search history.

(56) References Cited

U.S. PATENT DOCUMENTS

| | | | |
|---|---|---|---|
| 4,571,593 A | 2/1986 | Martinson | 343/783 |
| 4,819,004 A * | 4/1989 | Argintaru et al. | 343/778 |
| 7,554,504 B2 * | 6/2009 | Mohamadi | 343/776 |
| 7,835,600 B1 | 11/2010 | Yap et al. | 385/12 |
| 2010/0060537 A1 | 3/2010 | Nagayama | 343/776 |

* cited by examiner

*Primary Examiner* — Hoang V Nguyen
(74) *Attorney, Agent, or Firm* — Allen, Dyer, Doppelt, Milbrath & Gilchrist, P.A.

(57) ABSTRACT

An antenna device includes a housing having a plurality of printed circuit board (PCB) panels connected together with folded joints therebetween to define a polyhedral shape having a first open end. Each of the PCB panels includes a dielectric substrate and an electrically conductive layer thereon inside of the housing. Wireless communication circuitry is mounted on at least one of the plurality of PCB panels outside the housing, and an antenna feed is connected to the wireless communication circuitry adjacent a second end opposite the first open end of the housing.

24 Claims, 3 Drawing Sheets

HORN ANTENNA INCLUDING INTEGRATED ELECTRONICS AND ASSOCIATED METHOD

FIELD OF THE INVENTION

The present invention relates to the field of antennas, and, more particularly, to horn antennas and horn antenna arrays and related methods.

BACKGROUND OF THE INVENTION

In current practice, communications devices are used with many different types of dipoles, biconical dipoles, conical monopoles and discone antennas. These antennas, however, are sometimes large and include impractical shapes for a specific application.

Horn antennas are very popular at UHF (300 MHz-3 GHz) and higher frequencies. They often have a directional radiation pattern with a high gain, which can range up to 25 dB in some cases, with 10-20 dB being typical. Horn antennas have a wide impedance bandwidth. The bandwidth for practical horn antennas can be on the order of 20:1 (e.g. operating from 1 GHz-20 GHz), with a 10:1 bandwidth not being uncommon.

The gain of horn antennas often increases (and the beamwidth decreases) as the frequency of operation is increased. This is because the size of the horn aperture is measured in wavelengths. Horn antennas have very little loss, so the directivity of a horn is roughly equal to its gain.

U.S. Pat. No. 4,571,593 to Martinson entitled "Horn antenna and mixer construction for microwave radar detectors" is directed to a horn antenna, for use in microwave radar detector circuits, that comprises a molded horn element that is open at its bottom side, with a ridge molded into its flared top surface, and being electrically conductive at least at microwave frequencies such as in the X-band and K-band. The open bottom of the horn element mates to a conductive upper surface on a mounting board, and the horn is drawn down onto the mounting board so that its upper surface forms the bottom of the horn. Thus, the ridge is brought into physical and electrical contact with a feed strip formed in a microstrip board on the mounting board, that has a mixing diode or diodes associated therewith. By this construction, there is a positive and dimensionally stable association of the throat of the horn and the ridge to the feed strip and the mixing diode (s), without the necessity of any solder, inserted connectors or mounting pins, or the provision of any tuning posts or screws.

U.S. Pat. No. 7,835,600 to Yap, et al. entitled "Microwave receiver front-end assembly and array" is directed to a method of and apparatus for modulating an optical carrier by an incident electromagnetic field. The electromagnetic field propagates in a dielectric-filled transverse electromagnetic waveguide, At least one slice of an electro-optic material is disposed in the dielectric-filled transverse electromagnetic waveguide, the electro-optic material in the dielectric-filled transverse electromagnetic waveguide having at least one optical waveguide therein which has at least a major portion thereof guiding light in a direction orthogonal with respect to a direction in which the dielectric-filled transverse electromagnetic waveguide guides the incident electromagnetic field.

Phased array antennas typically have high size, weight and power (SWaP) and cost issues. Such high cost limits conventional phased arrays to high end applications. A typical brick array architecture provides high bandwidth and dense element spacing but is complicated and heavy. A conventional tile array architecture can use a lower cost printed circuit board approach and is lighter than the brick architecture, but it has less packaging volume for electronics, including power, control and the RF beamformer. Such tile arrays also typically require weight to be added to improve stiffness, e.g. to oppose vibrations etc.

Reducing the size, weight and cost of a horn antenna is desired. Providing a lightweight phased array is also desired.

SUMMARY OF THE INVENTION

In view of the foregoing background, it is therefore an object of the present invention to provide a horn antenna and associated array which is relatively lightweight, low cost and has desired bandwidth.

This and other objects, features, and advantages in accordance with the present invention are provided by a horn antenna device including a housing comprising a plurality of PCB panels connected together with folded joints therebetween to define a polyhedral shape having a first open end. Each of the PCB panels includes a dielectric substrate and an electrically conductive layer thereon inside of the resultant housing created by the implementation of the aforementioned folded joints. Wireless communication circuitry is mounted on at least one of the plurality of PCB panels outside the housing, and an antenna feed is connected to the wireless communication circuitry adjacent a second end opposite the first open end of the housing.

The second end of the polyhedral shape may be open, and the horn antenna device may further include a base PCB panel mounting the housing thereon adjacent the second end. The antenna feed may include a feed trace positioned on the PCB base panel. The antenna feed may include an orthogonal pin feed.

Also, each of the plurality of PCB panels may comprise a flat polygon shaped panel. The electrically conductive layer may comprise a continuous metallization layer or a mesh metallization layer on the inside of the PCB panels.

A horn antenna array includes a base PCB, and a plurality of horn antenna devices mounted in an array on the base PCB. Antenna feeds are positioned on a top surface of the base PCB and respectively connected to the wireless communication circuitry of each horn antenna device adjacent a second end thereof opposite the open end of the housing. Array electronic components are positioned on a bottom surface of the base PCB and coupled to the antenna feeds. The base PCB may comprise vias connecting the antenna feeds and the array electronic components. Connection strips may secure edges of the plurality of horn antenna devices together adjacent the first open ends thereof.

A method aspect is directed to a method of making a horn antenna device comprising: forming a plurality of PCB panels on a dielectric substrate having an electrically conductive layer thereon; forming wireless communication circuitry on at least one of the plurality of PCB panels; forming a housing by folding the plurality of PCB panels connected together with folded joints therebetween to define a polyhedral shape having a first open end, and with the electrically conductive layer on an inside of the housing, and the wireless communications circuitry outside the housing; and connecting an antenna feed to the wireless communication circuitry adjacent a second end of the housing opposite the first open end of the housing.

DETAILED DESCRIPTION OF THE PREFERRED EMBODIMENTS

Figure 1:
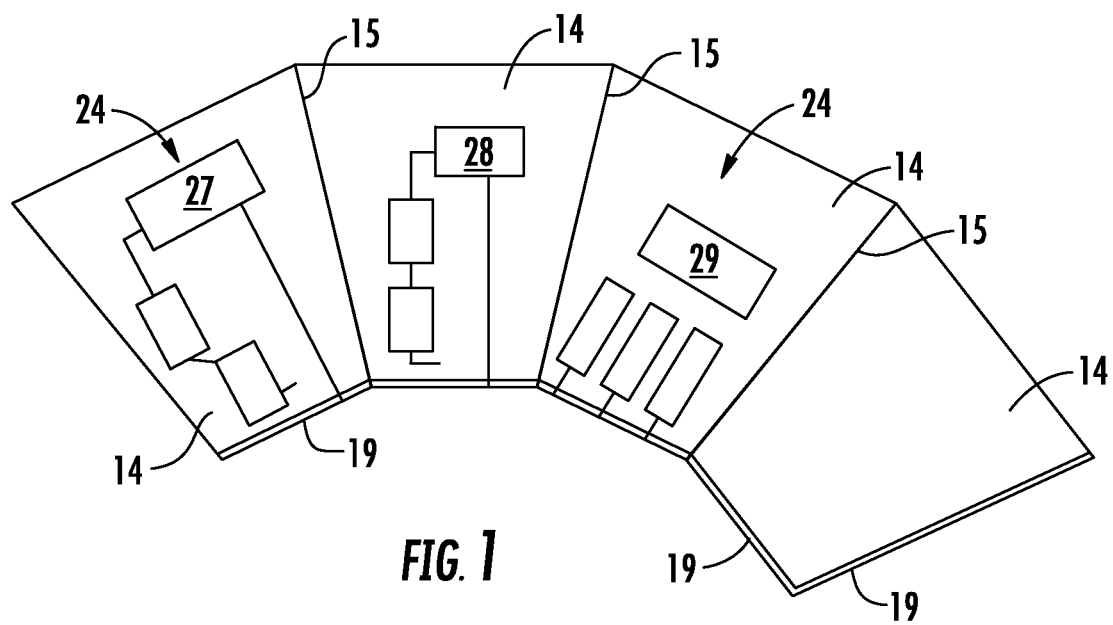
FIG. 1 is a plan view of the printed circuit board panels of an unassembled horn antenna device according to an embodiment of the present invention.
Figure 2:
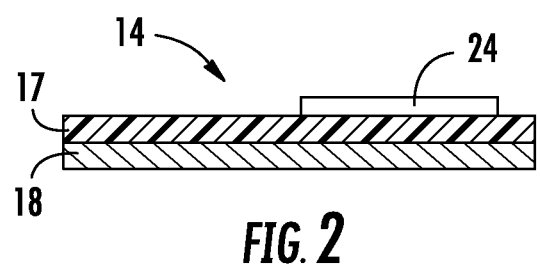
FIG. 2 is a cross-sectional view of a printed circuit panel of FIG. 1 according to an embodiment of the present invention.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Referring initially to FIGS. 1-4, a low cost, low weight broadband antenna device 10, e.g. a horn antenna device, and methods of making such devices will now be described. The horn antenna device 10 includes a housing 12 defined by a plurality of printed circuit board (PCB) panels 14 connected together with folded joints or corners 16 therebetween to define a polyhedral shape having a first open end 20. Each of the PCB panels 14 includes a dielectric substrate 17 and at least one electrically conductive layer 18 thereon inside of the housing. The dielectric substrate may be a thin liquid crystal polymer (LOP) substrate.

Preferably, the entire internal surface of the panels 14 is metallized to define the electrically conductive layer 18. However, the electrically conductive layer 18 may comprise, for example, a continuous metallization layer or a mesh metallization layer 21 (as illustrated by the dashed cross-hatching in FIG. 3) on the inside of the PCB panels 14. Such a metallization layer may be thin electroplated copper, for example. Each of the plurality of panels 14 may comprise a flat polygon shaped panel.

Wireless communication circuitry 24 is mounted on at least one of the plurality of PCB panels 14 outside the housing 12. Such circuitry 24 may include transmit/receive electronics, such as horizontal polarization Tx/Rx circuitry 27, vertical polarization Tx/Rx circuitry 28 and DC/DC converter and/or digital circuitry 29 which is mounted on the outside of the housing 12. An antenna feed 30, such as an orthogonal pin feed (illustrated in FIG. 3), is connected to the circuitry 24. The circuitry 24 may be associated with octave-bandwidth communication. The horn antenna device 10 may be used in various applications including commercial and/or surveillance applications, such as RADAR, space satellites, airborne vehicles and communications, for example.

The antenna feed 30 is connected to the wireless communication circuitry 24 adjacent a second end 26 opposite the first open end 20 of the housing 12. The second end 26 of the polyhedral shape housing 12 may be open, and the horn antenna device 10 may further include a base PCB panel 40 mounting the housing 12 thereon adjacent the second end 26. The base panel 40 may be defined by a dielectric substrate 42, feed trace or stripline 44 and electronic components 46, such as a radio, sensor and/or a battery. Such components 46 may be connected to the feed trace 44 with vias 48.

Figure 3:
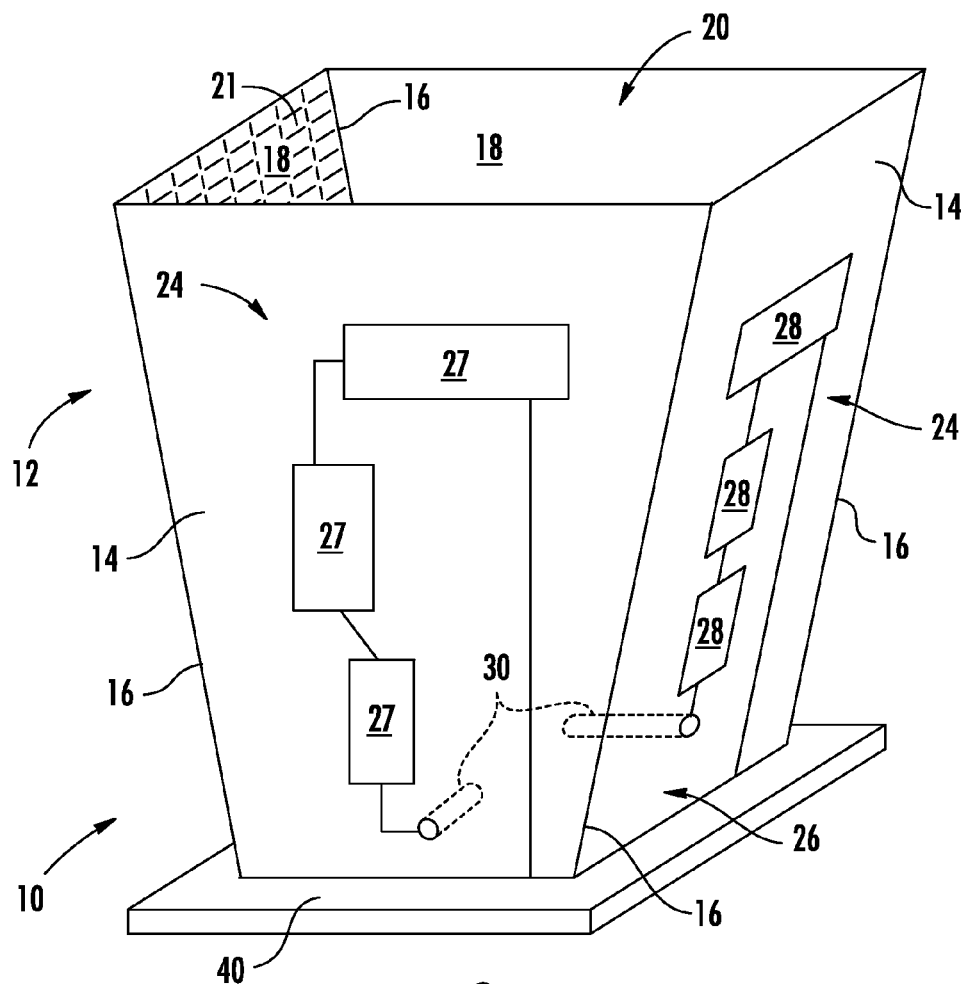
FIG. 3 is a plan view of a horn antenna device according to an embodiment of the present invention.
Figure 4:
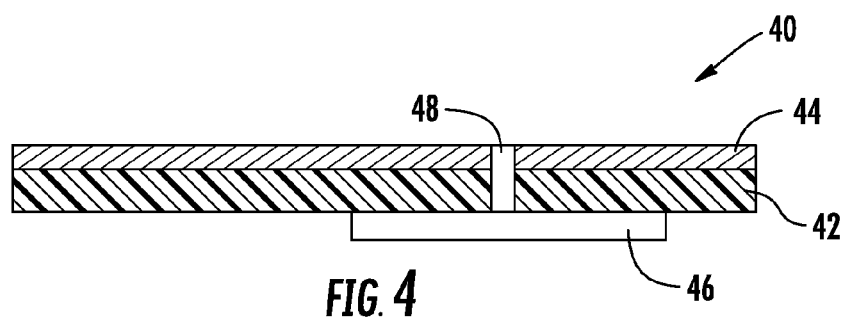
FIG. 4 is cross-sectional view of a base printed circuit panel for a horn antenna device according to an embodiment of the present invention.

Multiple sets of PCB panels 14 may be defined in a larger PCB sheet, such as a liquid crystal polymer substrate, that includes fold-lines 15, defining the panels 14, so that the board may be folded there-along to create the folded joints 16 and the closed geometric shape, such as the pyramidal shape illustrated in FIG. 3. A joint 16 may be soldered or otherwise connected to complete the housing 12. Other shapes, and corresponding beam profiles, are contemplated as long as they define and radiate waves as an antenna.

The shape of the panels 14 should provide a planar fold-up method of manufacturing. The panels 14 may include flaps or tabs 19 for mating with appropriate slots when forming or mounting the housing 12. Again, a flat sheet of substrate material can be tiled with a plurality of the unfolded antenna housings 12 which would also allow for low-cost printed wiring board (PWB) fabrication and/or surface mount technology (SMT) techniques to be used. As discussed, after folding up the panels 14 of the antenna housing 12, the exterior walls define PWBs for circuitry/electronics 24 associated with the antenna device 10.

The housing 12 can also be created by folding into a resultant shape that has internal walls or ridges on at least one of the panels 14. This may be desirable to tune the specific bandwidth or efficiency of the radiating structure. Alternatively such ridges could be added to the housing 12, e.g. at a location thereon with inherent receiving features (i.e. slot, metallization, etc.).

Figure 5:
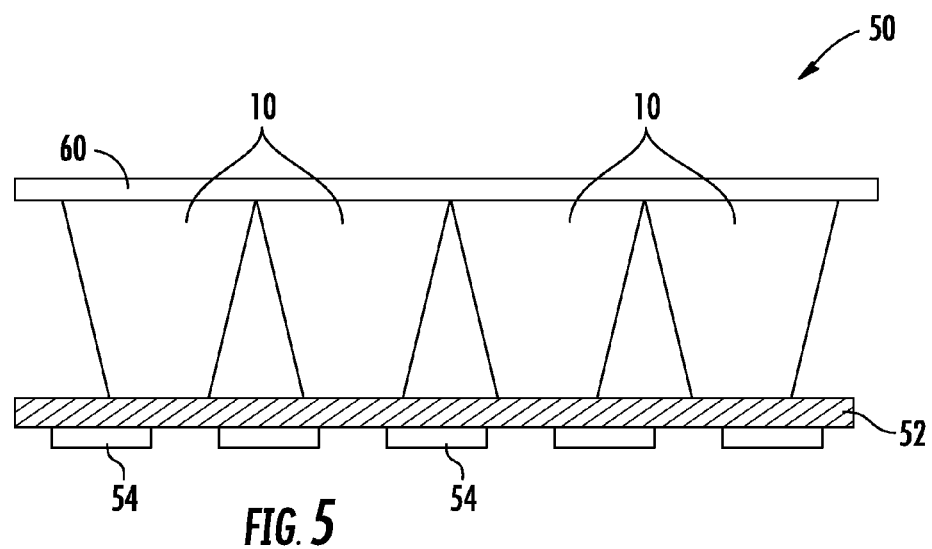
FIG. 5 is a cross-sectional view of a 4×4 horn antenna array according to an embodiment of the present invention.
Figure 6:
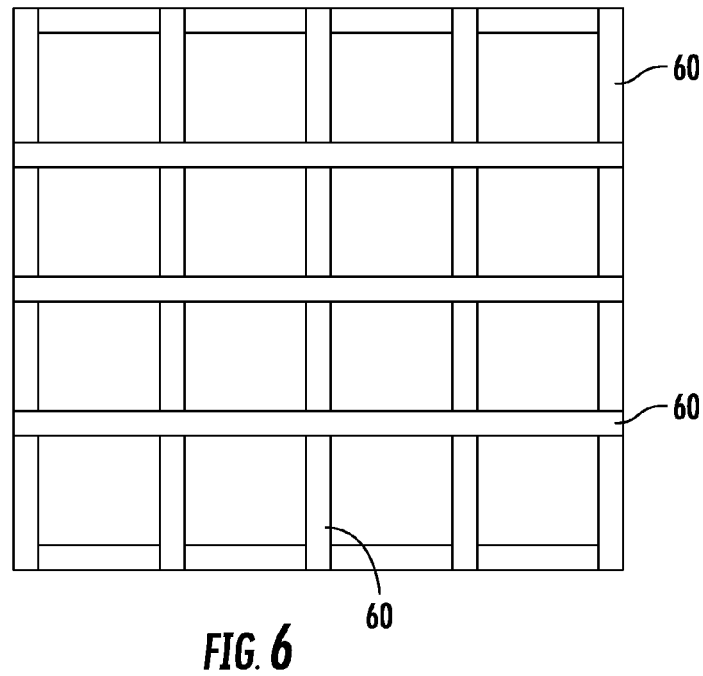
FIG. 6 is a top view of the 4×4 horn antenna array of FIG. 5.

Referring now additionally to FIGS. 5 and 6, a horn antenna array 50 that is lightweight, low-cost and mechanically sound will be described. The horn antenna array 50 includes a base PCB or sub-panel 52, and a plurality of horn antenna devices 10 mounted in an array, e.g. a 4×4 array, on the base PCB 52. As with the base panel 40 (FIG. 4), portions of the antenna feeds are positioned on a top surface of the base PCB 52 and respectively connected to the wireless communication circuitry 24 of each horn antenna device 10 adjacent a second end 26 thereof opposite the open end of the housing 12.

Array electronic components 54 are positioned on a bottom surface of the base PCB 52 and coupled to the antenna feed portions. The base PCB 52 may comprise vias connecting the antenna feeds and the array electronic components 54, as illustrated with respect to the embodiment of FIGS. 3 and 4. Such sub-panel electronic components 54 provide power distribution, phase, amplitude, and delay control and RF beamforming, for example. The base PCB 52 may be formed using a flexible PWB, such as a liquid crystal polymer (LCP), which would support the array 50 being a conformal antenna array.

Connection strips 60 may secure edges of the plurality of horn antenna devices 10 together adjacent the first open ends 20 thereof. The connection strips 60, such as tape or other structural connection method, define a mechanical interconnect layer (e.g. a window frame) that provides mechanical stiffness in conjunction with the z-axis horn antenna device 10 dimension. Thus, no additional weight is needed to increase the stiffness of the array 50.

A method aspect is directed to a method of making a horn antenna device 10 including forming a plurality of PCB panels 14 on a dielectric substrate 17 having an electrically conductive layer 18 thereon. Wireless communication circuitry 24 is formed on at least one of the plurality of PCB panels 14, and a housing 12 is formed by folding the plurality of PCB panels 14 connected together with folded joints 16 therebetween to define a polyhedral shape having a first open end 20, and with the electrically conductive layer 18 on an inside of the housing 12 and the wireless communications circuitry 24 outside the housing 12. The method includes connecting an antenna feed 30 to the wireless communication circuitry 24 adjacent a second end 26 of the housing 12 opposite the first open end 20 of the housing.

The method may include providing a base PCB 52, positioning a plurality of antenna feeds 44 on a top surface of the base PCB, positioning array electronic components 54 on a bottom surface of the base PCB or on the top surface interstitially located between the housings 12 and coupled to the antenna feeds, mounting a plurality of antenna horn devices 10 on the base PCB, and connecting respective antenna feeds to the wireless communication circuitry of each horn antenna device. Edges of the plurality of horn antenna devices 10 may be secured together with connection strips 60 adjacent the first open ends 20 thereof.

Accordingly, a horn antenna device with a reduced size, weight and volume is provided. RF losses are reduced due to shorter proximity of electronics to the antenna feed. A lightweight antenna array may be formed using low-cost SMT assembly techniques.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An antenna device comprising:
    a housing comprising a plurality of printed circuit board (PCB) panels connected together with folded joints therebetween in a polyhedral shape having a first open end;
    each of the PCB panels comprising a dielectric substrate and an electrically conductive layer thereon on the inside of the housing;
    wireless communication circuitry mounted on at least one of the plurality of PCB panels outside the housing; and
    an antenna feed connected to the wireless communication circuitry adjacent a second end of said housing opposite the first open end of the housing.

2. An antenna device according to claim 1 further comprising a base PCB panel mounting the housing thereon adjacent the second end.

3. An antenna device according to claim 2, wherein the antenna feed comprises a feed trace positioned on the base PCB panel.

4. An antenna device according to claim 1, wherein each of the plurality of PCB panels comprises a flat polygon shaped panel.

5. An antenna device according to claim 1, wherein the electrically conductive layer comprises a continuous metallization layer.

6. An antenna device according to claim 1, wherein the electrically conductive layer comprises a mesh metallization layer.

7. An antenna device according to claim 1, wherein the antenna feed comprises an orthogonal pin feed.

8. An antenna array comprising:
    a base printed circuit board (PCB);
    a plurality of antenna devices mounted in an array on the base PCB each comprising:
        a housing comprising a plurality of PCB panels connected together with folded joints therebetween to define a polyhedral shape having a first open end, each of the PCB panels comprising a dielectric substrate and an electrically conductive layer thereon on the inside of the housing, and
        wireless communication circuitry mounted on at least one of the plurality of PCB panels outside the housing;
        antenna feeds positioned on a top surface of the base PCB and respectively connected to the wireless communication circuitry of each antenna device adjacent a second end thereof opposite the open end of the housing; and
    array electronic components positioned on a surface of the base printed circuit board and coupled to the antenna feeds.

9. An antenna array according to claim 8 wherein, in each of the plurality of horn antenna devices, the second end of the polyhedral shape is closed by the base PCB.

10. An antenna array according to claim 8, wherein the antenna feeds comprise feed traces positioned on the base PCB.

11. An antenna array according to claim 8, wherein each of the plurality of PCB panels comprises a flat polygon shaped panel.

12. An antenna array according to claim 8, wherein the electrically conductive layer comprises a continuous metallization layer.

13. An antenna array according to claim 8, wherein the electrically conductive layer comprises a mesh metallization layer.

14. An antenna array according to claim 8, wherein the base PCB comprises vias connecting the antenna feeds and the array electronic components.

15. An antenna array according to claim 8, further comprising connection strips securing edges of the plurality of horn antenna devices together adjacent the first open ends thereof.

16. A method of making an antenna device comprising:
    forming a plurality of printed circuit board (PCB) panels on a dielectric substrate having an electrically conductive layer thereon;
    forming wireless communication circuitry on at least one of the plurality of PCB panels;
    forming a housing by folding the plurality of PCB panels connected together with folded joints therebetween to define a polyhedral shape having a first open end, and with the electrically conductive layer on an inside of the housing, and the wireless communications circuitry outside the housing; and
    connecting an antenna feed to the wireless communication circuitry adjacent a second end of the housing opposite the first open end of the housing.

17. A method according to claim 16, further comprising mounting the housing on a base PCB panel adjacent the second end.

18. A method according to claim 17, wherein connecting the antenna feed comprises positioning a feed trace on the PCB base panel.

19. A method according to claim 16, wherein forming each of the plurality of PCB panels comprises forming a flat polygon shaped panel.

20. A method according to claim 16, wherein forming the plurality of PCB panels comprises forming the electrically conductive layer as a continuous metallization layer.

21. A method according to claim 16, wherein forming the plurality of PCB panels comprises forming the electrically conductive layer as a mesh metallization layer.

22. A method according to claim 16, wherein connecting the antenna feed comprises providing an orthogonal pin feed.

23. A method according to claim 16, further comprising:
   providing a base PCB;
   positioning a plurality of antenna feeds on a first surface of the base PCB;
   positioning array electronic components on a second surface of the base PCB and coupled to the antenna feeds;
   mounting a plurality of antenna horn devices on the base PCB; and
   connecting respective antenna leads to the wireless communication circuitry of each horn antenna device.

24. A method according to claim 23, further comprising securing edges of the plurality of horn antenna devices together with connection strips adjacent the first open ends thereof.

* * * * *